United States Patent
Yang

(10) Patent No.: US 7,436,047 B2
(45) Date of Patent: Oct. 14, 2008

(54) WAFER HAVING SCRIBE LANES SUITABLE FOR SAWING PROCESS, RETICLE USED IN MANUFACTURING THE SAME, AND METHOD OF MANUFACTURING THE SAME

(75) Inventor: Hung-Mo Yang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 64 days.

(21) Appl. No.: 11/530,568

(22) Filed: Sep. 11, 2006

(65) Prior Publication Data

US 2007/0057349 A1 Mar. 15, 2007

(30) Foreign Application Priority Data

Sep. 13, 2005 (KR) ........................ 10-2005-0085294

(51) Int. Cl.
*H01L 23/544* (2006.01)
(52) U.S. Cl. ............... 257/620; 257/E23.001; 257/E23.002
(58) Field of Classification Search ................. 257/620, 257/E23.001, E23.002; 438/462
See application file for complete search history.

(56) References Cited

U.S. PATENT DOCUMENTS

| | | | |
|---|---|---|---|
| 6,441,465 B2 * | 8/2002 | Lin et al. ..................... | 257/620 |
| 6,879,019 B2 * | 4/2005 | Windlass et al. ............ | 257/529 |
| 6,879,025 B2 * | 4/2005 | Sasaki et al. ................ | 257/620 |
| 2005/0101108 A1 * | 5/2005 | Genda et al. ................ | 438/462 |
| 2006/0223234 A1 * | 10/2006 | Terayama et al. ........... | 438/113 |
| 2007/0222037 A1 * | 9/2007 | Wu ............................ | 257/620 |

FOREIGN PATENT DOCUMENTS

| | | |
|---|---|---|
| KR | 1999-00485 | 1/1999 |
| KR | 2003-0001880 | 1/2003 |
| KR | 2005-0010698 | 1/2005 |

OTHER PUBLICATIONS

English language abstract of Korean Publication No. 1999-00485.
English language abstract of Korean Publication No. 2003-0001880.
English language abstract of Korean Publication No. 2005-0010698.

* cited by examiner

*Primary Examiner*—David A Zarneke
(74) *Attorney, Agent, or Firm*—Marger Johnson & McCollom, P.C.

(57) ABSTRACT

A wafer that is less susceptible to chipping or peeling during a sawing process is disclosed. The wafer includes a plurality of chips, scribe lanes formed between the plurality of chips, and a passivation film, which is formed on the plurality of chips and the scribe lanes and has a plurality of perforations, e.g. slit patterns engraved on each scribe lane. A photolithography reticle and method of manufacturing the wafer are also provided.

8 Claims, 11 Drawing Sheets

US 7,436,047 B2

WAFER HAVING SCRIBE LANES SUITABLE FOR SAWING PROCESS, RETICLE USED IN MANUFACTURING THE SAME, AND METHOD OF MANUFACTURING THE SAME

CROSS-REFERENCE TO RELATED APPLICATION

This application claims priority from Korean Patent Application No. 10-2005-0085294 filed on Sep. 13, 2005 in the Korean Intellectual Property Office, the contents of which are incorporated herein by reference in their entirety.

BACKGROUND

1. Technical Field

The disclosure relates to a wafer having scribe lanes suitable for a sawing process, a reticle used in manufacturing the wafer, and a method of manufacturing the wafer.

2. Description of the Related Art

Generally, after a plurality of chips are formed on a wafer, a sawing process is performed. In the sawing process, a diamond blade rotating at high speed cuts the wafer along scribe lanes to separate the chips from one another.

However, in the conventional sawing process, chipping occurs in each chip due to mechanical stress caused by the blade, and worse, cracks occur in a passivation film and an interlayer insulating film of the chip, thereby causing defects in the chip.

On the other hand, when the passivation film is completely opened along the scribe lanes in order to prevent the mechanical stress from being transmitted through a hard passivation film, peeling occurs. The peeling is a defect where a part of a metal layer forming alignment marks or a part of a metal layer of a pad window connected to a test element group is peeled off from the metal layer in the sawing process. In particular, the undesirable peeling may cause short circuiting of wires in a multi-chip package.

SUMMARY

According to one embodiment, a wafer includes a plurality of chips, scribe lanes formed between the plurality of chips, and a passivation film, which is formed on the plurality of chips and the scribe lanes and has a plurality of slit patterns engraved on each scribe lane.

According to another embodiment, a reticle includes a substrate having a plurality of chip areas and scribe lane areas, the substrate being transparent against exposure light, and a light-shielding pattern formed on the transparent substrate and having a plurality of transparent portions in the scribe lane areas. The transparent portions correspond to a plurality of slit patterns to be engraved on a passivation film formed on a wafer.

According to still another embodiment, a method of manufacturing a wafer includes forming a passivation film on a wafer, which includes scribe lanes formed between a plurality of chips, and engraving a plurality of slit patterns on the passivation film, which is formed on the scribe lanes.

Providing a plurality of openings such as slits in the scribe lane areas minimizes chipping and peeling during a sawing process as compared to the conventional process.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF EXAMPLE EMBODIMENTS

Figure 1:
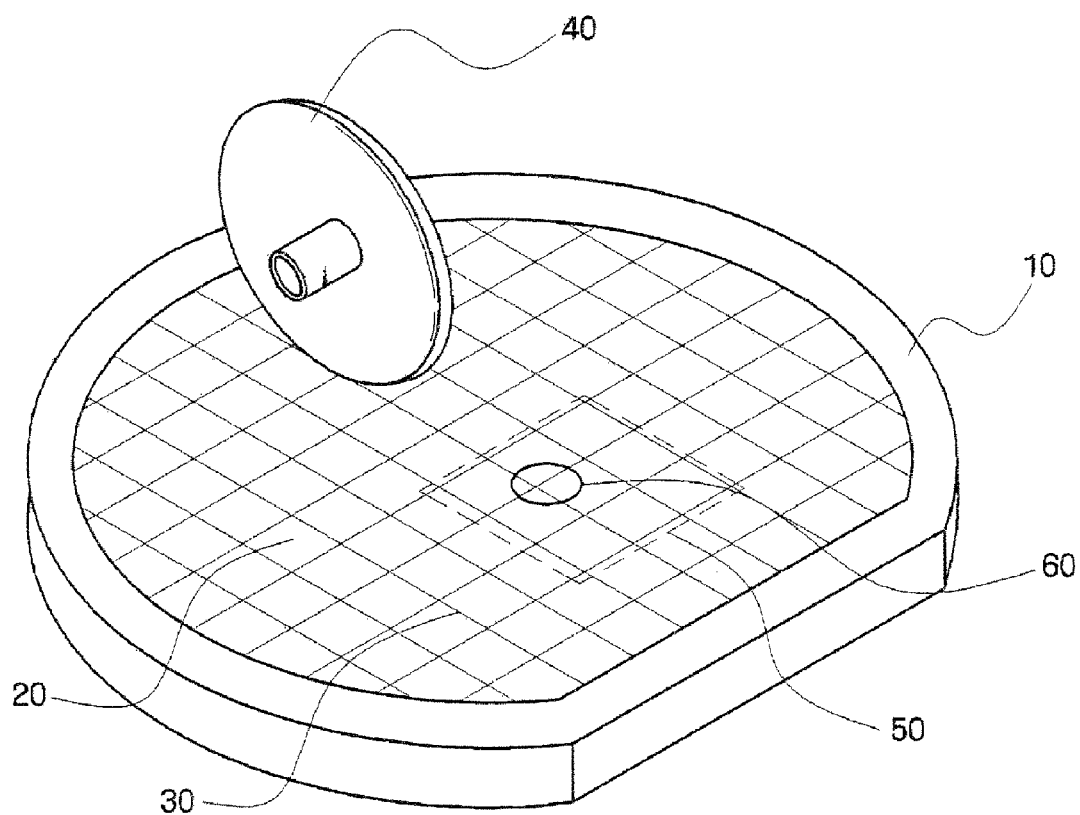
FIG. 1 is a perspective view of a wafer in which manufacturing processes and an electrical die sorting process have been completed.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will convey the concept of the invention to those skilled in the art. Accordingly, processes, element structures, and technologies known in some embodiments are not specifically described to avoid ambiguity. Like reference numerals refer to like elements throughout the specification.

Terms used in the present specification are used to describe embodiments, and do not limit the invention. Terms 'comprise' and/or 'comprising' used in the present specification are used so as not to exclude that described components, processes, operations, and/or elements are present in or added to one or more other components, processes, operations, and/ or elements. A term 'and/or' is used to include each of described items and one or more combinations of the items.

A wafer, in which chipping and peeling does not occur in a sawing process, having scribe lanes suitable for the sawing process will be described with reference to some embodiments. According to the embodiments, a passivation film on the scribe lanes includes a plurality of engraved slit patterns, and effectively prevents mechanical stress from being transmitted in the sawing process. Therefore, chipping does not occur. In addition, since slit patterns are not formed in areas having monitoring patterns such as alignment marks formed thereon, the peeling does not occur.

Hereinafter, a wafer according to some embodiments will be described in detail with reference to FIGS. 1 to 5.

FIG. 1 is a perspective view of a wafer 10 in which manufacturing processes and an EDS (electrical die sorting) process have been completed. The wafer 10 includes a plurality of chips 20 and scribe lanes 30. Each of the chips has a large scale integrated circuit formed thereon, and the scribe lanes are used to separate the plurality of chips 20 from one another by means of, for example, a diamond blade 40. The plurality of chips 20 are formed by several exposure processes performed in every shot unit 50.

Figure 2:
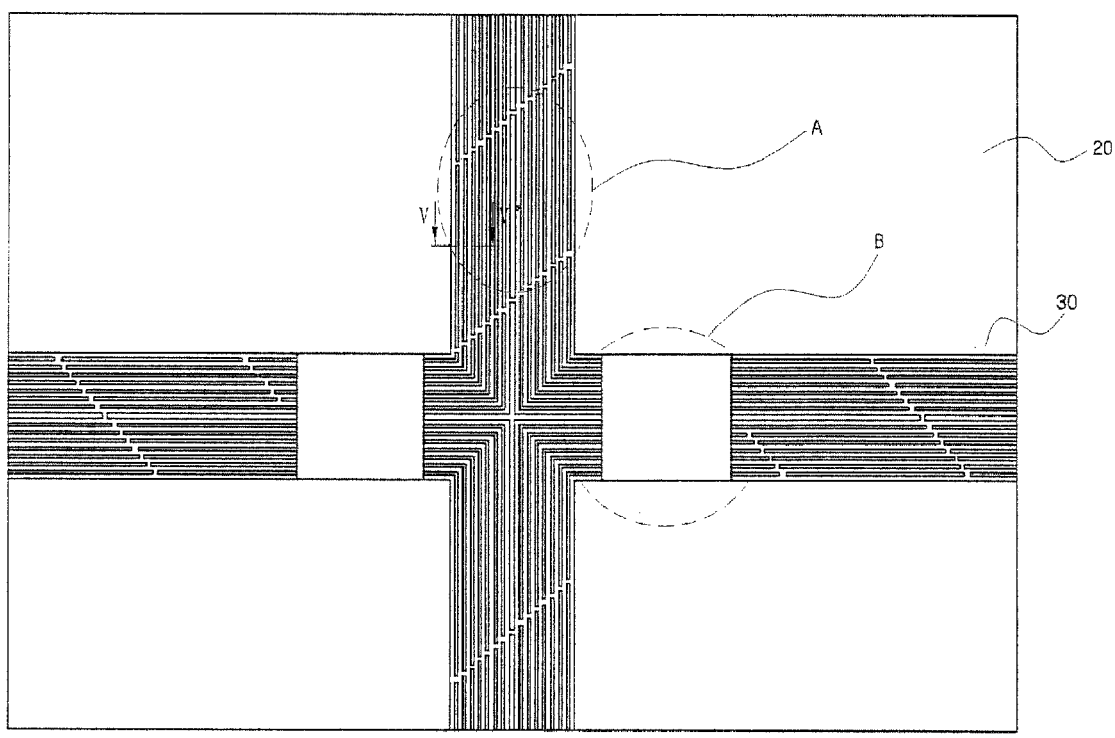
FIG. 2 is an enlarged plan view of a part of an area 60 shown in FIG. 1.
Figure 3A:
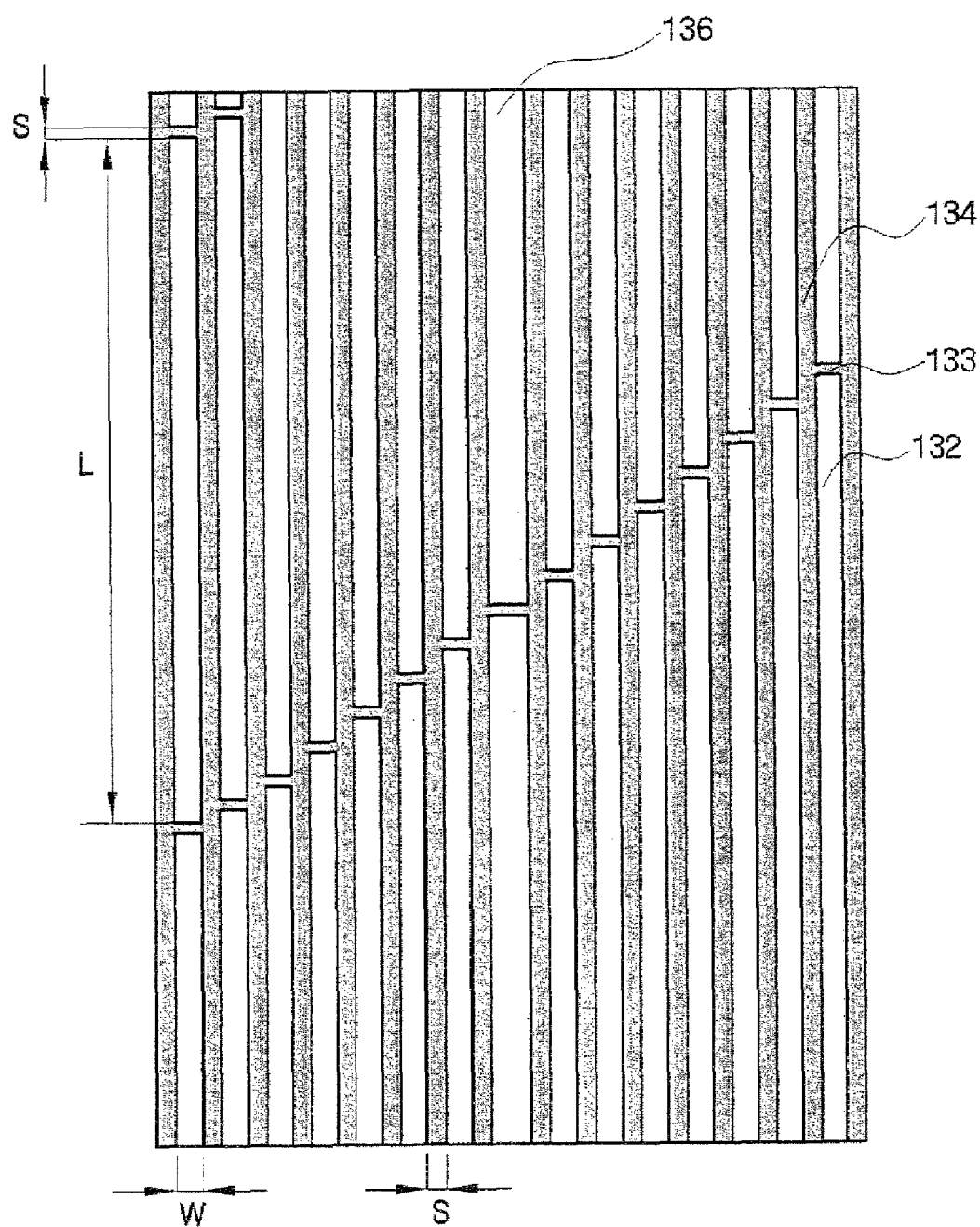
FIG. 3A is an enlarged plan view of an area A shown in FIG. 2.
Figure 3B:
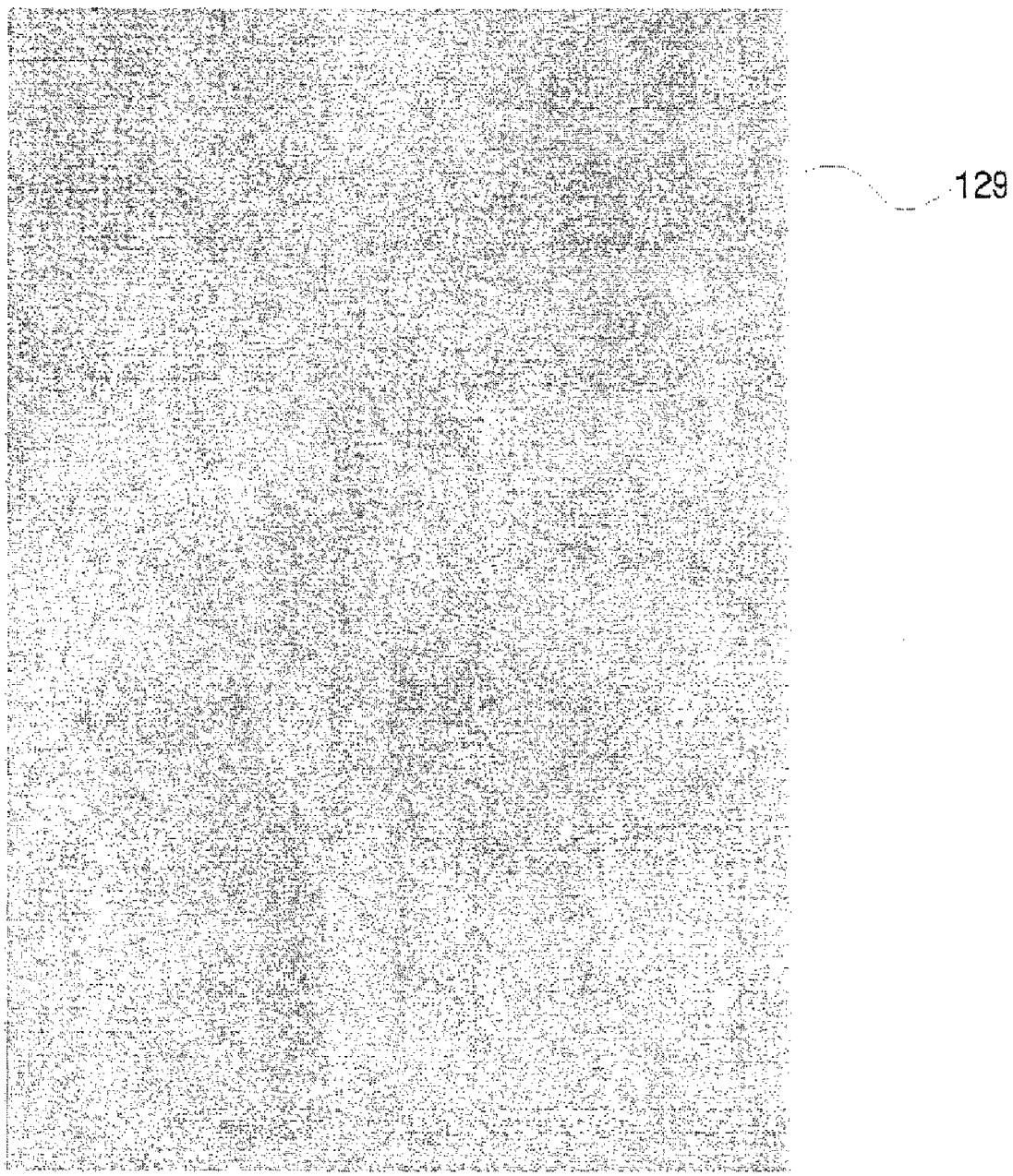
FIG. 3B is an enlarged plan view of an area B shown in FIG. 2.
Figure 4:
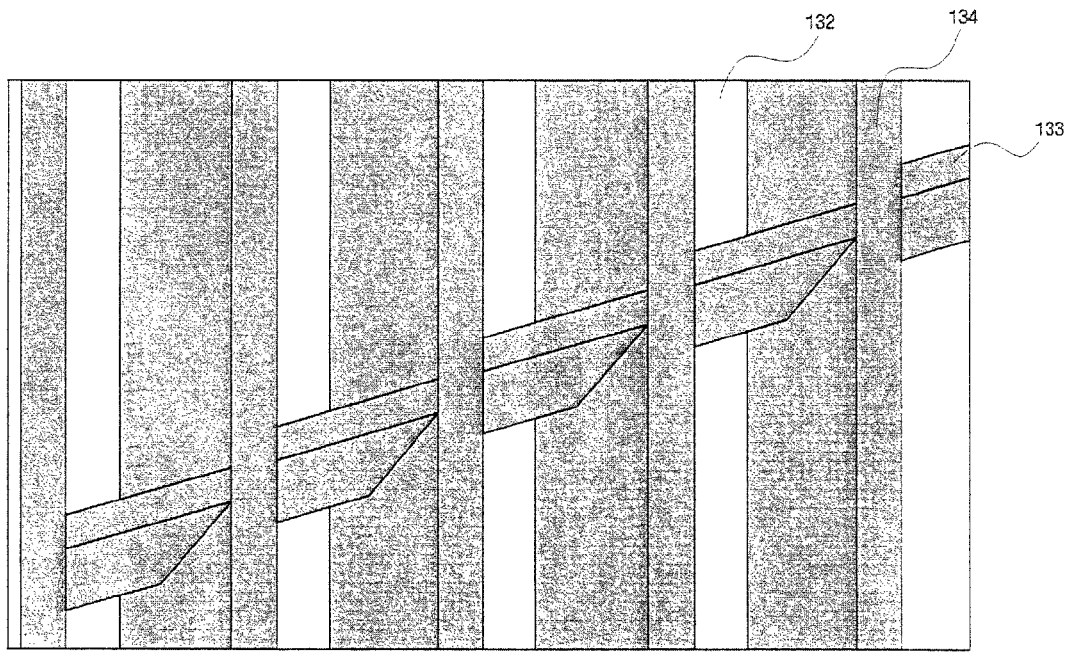
FIG. 4 is an enlarged perspective view showing a part of the area A shown in FIG. 2.
Figure 5:
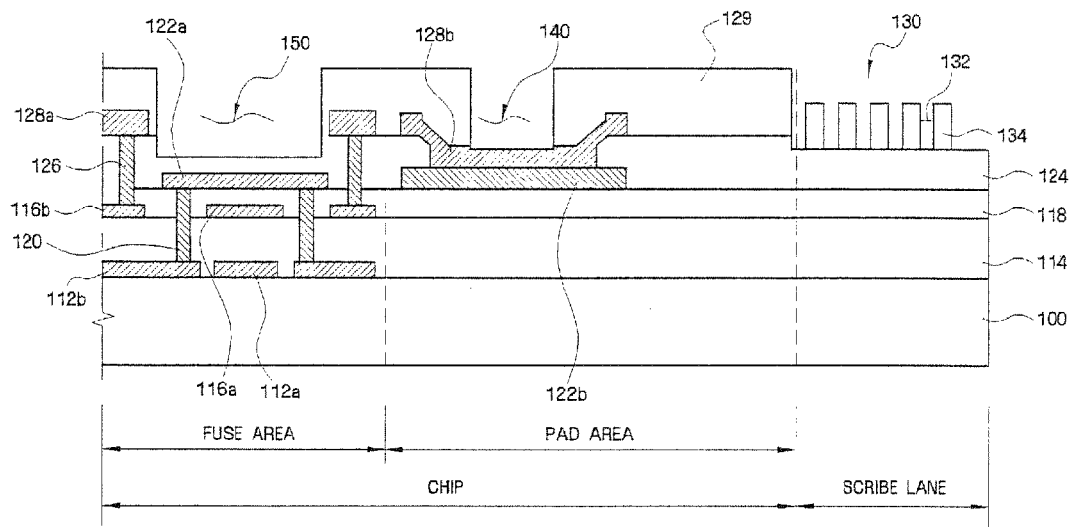
FIG. 5 is a cross-sectional view taken along line V-V' shown in FIG. 2.

FIG. 2 is an enlarged partial plan view showing a portion of an area 60 shown in FIG. 1, FIG. 3A is an enlarged plan view of an area A shown in FIG. 2, FIG. 3B is an enlarged plan view of an area B shown in FIG. 2, FIG. 4 is an enlarged perspective view showing a part of the area A shown in FIG. 2, and FIG. 5 is a cross-sectional view taken along line V-V' shown in FIG. 2.

First, referring to FIGS. 2 to 4, the wafer 10 includes the chips 20 and the scribe lanes 30. Each of the scribe lanes 30 includes areas A not having monitoring patterns formed thereon, and areas B having a plurality of monitoring patterns formed thereon. Each of the monitoring patterns includes a measuring pattern used to discriminate whether a formed film actually has a required thickness and size, an alignment pattern used to exactly align a stepper with the wafer in a photo process, and a TEG (test element group) used to measure electrical characteristics of the formed element. A local opening is formed to include a plurality of perforations that in accordance with one embodiment of the invention are substantially coextensive in two dimensions with, and overlay (are congruent with) the scribe lane. In accordance with the illustrated embodiment of the invention, the plurality of perforations take the form of plural elongated parallel slit patterns 132 engraved in a passivation film 129 formed in each scribe lane area A, which does not have monitoring patterns formed thereon. Specifically, the local opening includes a box-shaped enclosure pattern in which each of a plurality of passivation line patterns or strips 134 is connected to an adjacent one of the plurality of passivation line patterns 134 by a plurality of webs or bridges 133. Since adjacent ones of the plurality of passivation line patterns 134 are connected to one another, it is possible to prevent the passivation line patterns or strips 134 from falling down and to effectively prevent the passivation line patterns 134 from being lifted. Thus, a contiguous but perforated passivation region is formed coextensive with the scribe lane to absorb stress such as vibration and shock during wafer scribing and to prevent peeling.

The slit patterns 132 can be arranged at a predetermined pitch. The width W, the length L, and the space S of each slit pattern 132 are set in consideration of the width of each scribe lane 30 and falling down of the passivation line patterns 134. Furthermore, the slit patterns 132 are arranged from the edge of the chip 20 at constant intervals. When the width of each scribe lane 30 is not an integer multiple of the width W and space S of the slit pattern 132, the width of a central slit pattern 136 may be set larger than that of each of the other slit patterns 132 in order to more effectively prevent the chipping. In this case, the central slit pattern 136 is formed in a central area of each scribe lane 30 on which the diamond blade 40 passes. Although not shown in the drawings, the slit patterns may be configured such that the width of each slit pattern near the central area of each scribe lane is gradually larger than that of each slit pattern near the outside areas thereof.

Figure 7:
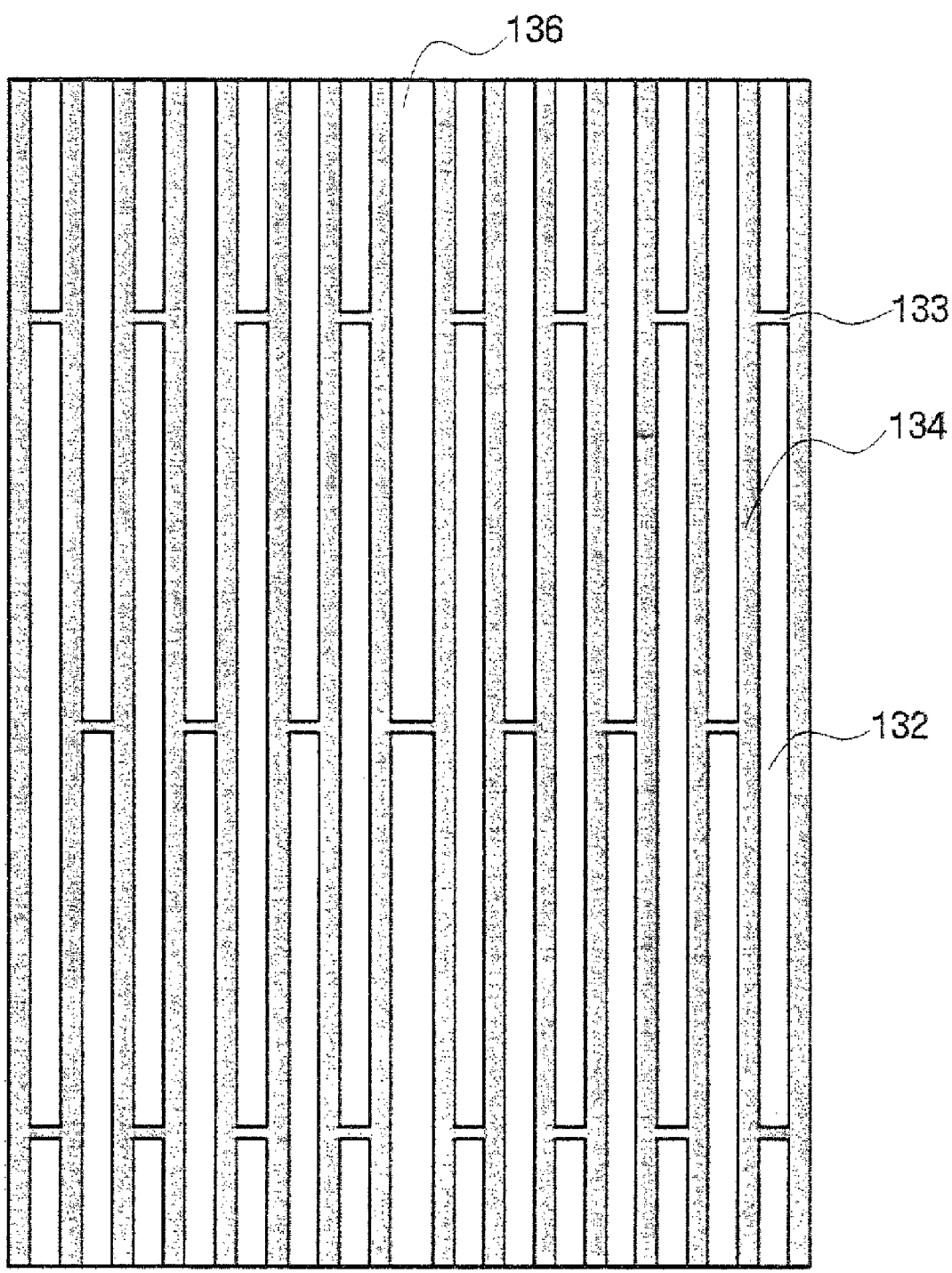
FIG. 7 is a plan view showing a scribe lane of a wafer according to other embodiments.

Meanwhile, when the webs or bridges 133 are not aligned with one another (but instead are offset from one another, i.e. dispersed, along the length of the passivation layer region overlaying the scribe lanes, as shown in FIGS. 3A and 7), it is possible to even further reduce the stress transmitted to the chips 20. Accordingly, it may be preferable that the ends of the engraved slit patterns 132 adjacent to each other are not aligned with each other. For instance, the ends of the slit patterns 132 may be staggered. Those of skill in the art will appreciate, however, that any perforation pattern in the passivation layer region overlying the scribe lane is effective in absorbing the stress imparted by scribing, and thus is contemplated as being within the spirit and scope of the invention.

According to some embodiments, the stress occurring in the sawing process using the diamond blade 40 is dispersed or distributed, and the plurality of passivation line patterns 134 serves as barriers against the stress to be laterally transmitted. Accordingly, it is possible for less chipping to occur. Furthermore, the slit patterns are not formed in each scribe lane area B having the monitoring pattern formed thereon, and the passivation film 129 remains in each scribe lane area B. Therefore, the peeling does not occur on the monitoring patterns in the sawing process.

Hereinafter, a cross-sectional structure of the wafer 10 according to some embodiments will be described in detail with reference to FIG. 5.

Each of the chips 20 includes a minute electronic element area (not shown), a fuse area, and a pad area. The fuse area has conductive lines 112a and 112b, which are formed by extending bit lines of the microelectronic device area on a substrate 100 having minute electronic elements such as transistors (not shown) thereon. The conductive line 112a provided below a fuse pattern 122a may be a buffer pattern film for absorbing an impact occurring when the fuse pattern 122a is cut, for example, by a laser. The conductive lines 112b may be electrically connected to the fuse pattern 122a through vias 120. The conductive line 116a provided below the fuse pattern 122a also serves as a buffer pattern film, and conductive lines 116b may be electrically connected to a guard ring pattern 128a thorough vias 126. The conductive lines 116a and 116b may be composed of a conductive layer that forms upper electrodes of a capacitor in case of a DRAM device. However, the conductive lines 116a and 116b are not limited to this, and may be omitted. Furthermore, although the fuse pattern 122a is composed of a single metal layer in FIG. 5, the fuse pattern 122a may be composed of a conductive layer that forms bit lines.

The pad area includes a pad electrode, i.e., a bond pad, which has a first metal pattern 122b composed of a single metal layer similar to the fuse pattern 122a and a second metal pattern 128b in contact with the first metal pattern 122b.

If the engraved slit patterns 132 defining the passivation line patterns 134 constituting the local opening 130 of the scribe lane, and a fuse opening 150 are formed at the same time, the process of manufacturing the wafer can be simplified. Accordingly, the depth of each engraved slit pattern 132 may be substantially equal to that of the fuse opening 150. For example, the depth of each slit pattern 132 may be in the range of 2.2 to 2.7 μm in the case of a DRAM device in which the fuse pattern 122a is composed of a single metal layer as shown in FIG. 5. In addition, although not shown in FIG. 5, the depth of each slit pattern 132 may be in the range of 4 to 4.5 μm in case of a DRAM device in which the fuse pattern is composed of a conductive layer that forms bit lines. However, the depth of each slit pattern 132 may be variously modified depending on what composes the fuse pattern in accordance with the kind of the microelectronic devices.

Furthermore, the fuse opening 150 of the chip area, the local opening 130 of the scribe lane, and a pad opening 140 may be simultaneously formed.

Reference numerals 114 and 118 indicate interlayer insulating films, reference numeral 124 indicates an intermetallic insulating film, and reference numeral 129 indicates a passivation film.

Figure 6:
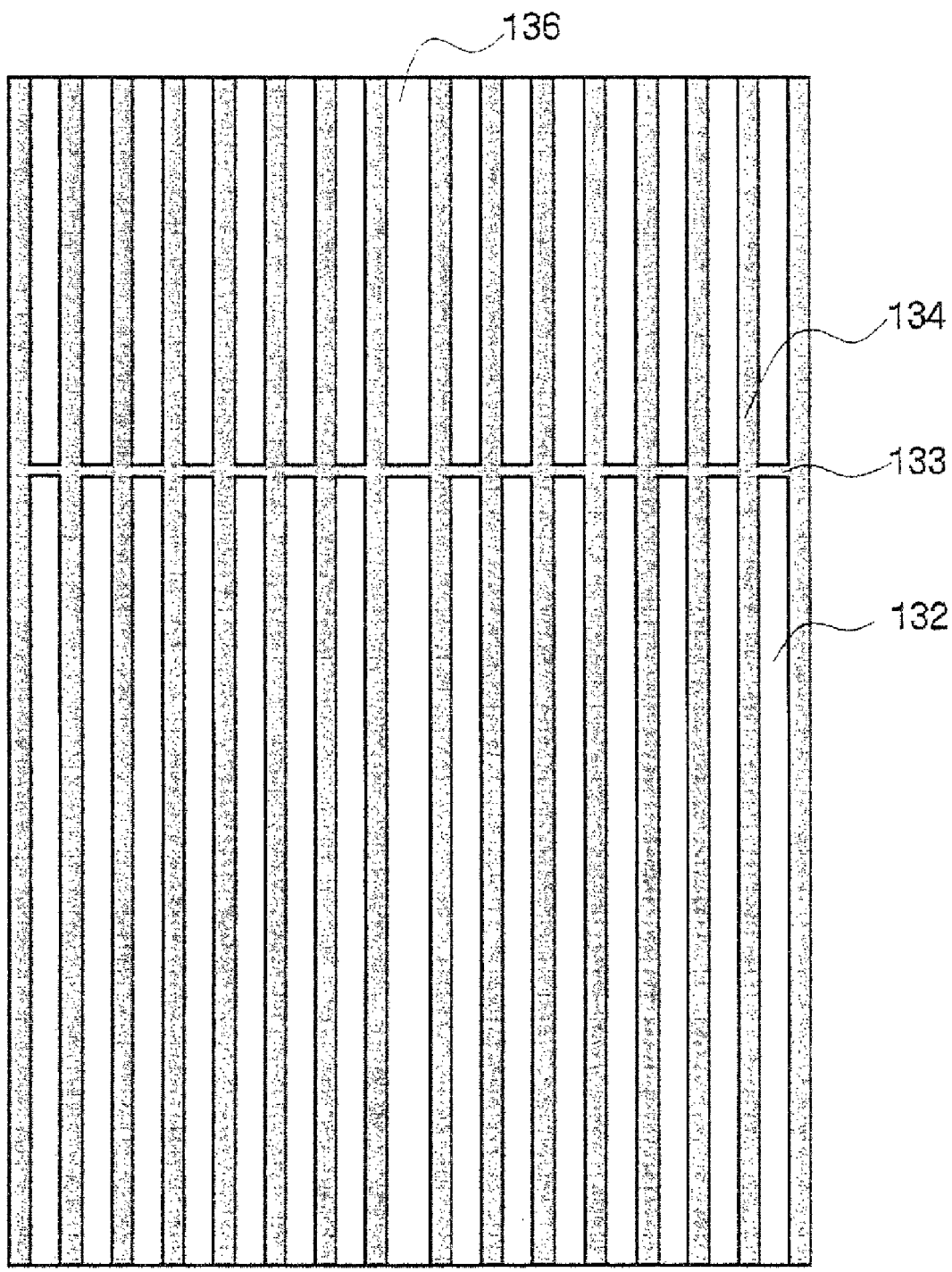
FIG. 6 is a plan view showing a scribe lane of a wafer according to some embodiments.

FIGS. 6 and 7 are plan views of scribe lanes of wafers according to some embodiments.

As shown in FIG. 6, slit patterns 132 may be arranged so that the ends thereof are aligned with one another. Alternatively, as shown in FIG. 7, the slit patterns 132 may be alternately arranged.

When the slit patterns 132 are alternately arranged as shown in FIG. 7, it is possible to more effectively prevent mechanical stress from being transmitted through bridges 133.

Hereinafter, exemplary methods of manufacturing wafers according to some embodiments, and a reticle used in the exemplary methods thereof will be described with reference to FIGS. 8 to 12. Hereinafter, processes related to processes known to those skilled in the art are schematically described in the following description of the methods in order to avoid ambiguity.

Figure 8:
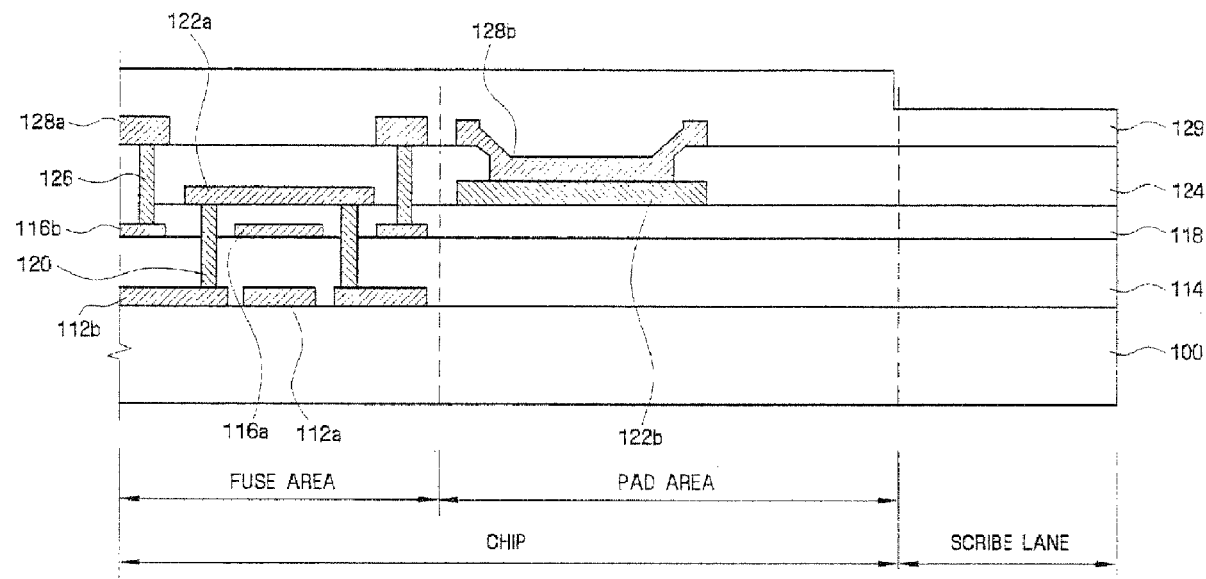
FIGS. 8 to 12 are views illustrating exemplary methods of manufacturing wafers according to some embodiments.

Referring to FIG. 8, a wafer 10, in which all of the processes until the process of manufacturing the passivation film 129 have been completed, is prepared. Specifically, the microelectronic devices are formed in a microelectronic device area (not shown) of the chip, and the fuse pattern 122*a* and guard ring pattern 128*a* are formed in the fuse area. Further, the pad electrode, which includes the first metal pattern 122*b* and the second metal pattern 128*b*, is formed in the pad area, and the monitoring patterns (not shown) are formed in the scribe lane. Then, the passivation film 129 is ultimately formed. The process of manufacturing each of the patterns forming the areas may be variously modified in accordance with processes known to those skilled in the art of a semiconductor device. Accordingly, the process of manufacturing each of the patterns is schematically described in order to avoid ambiguity.

After that, the slit patterns 132 are engraved on the scribe lane. The engraving of the slit patterns will be described with reference to FIGS. 9 to 12.

Figure 9:
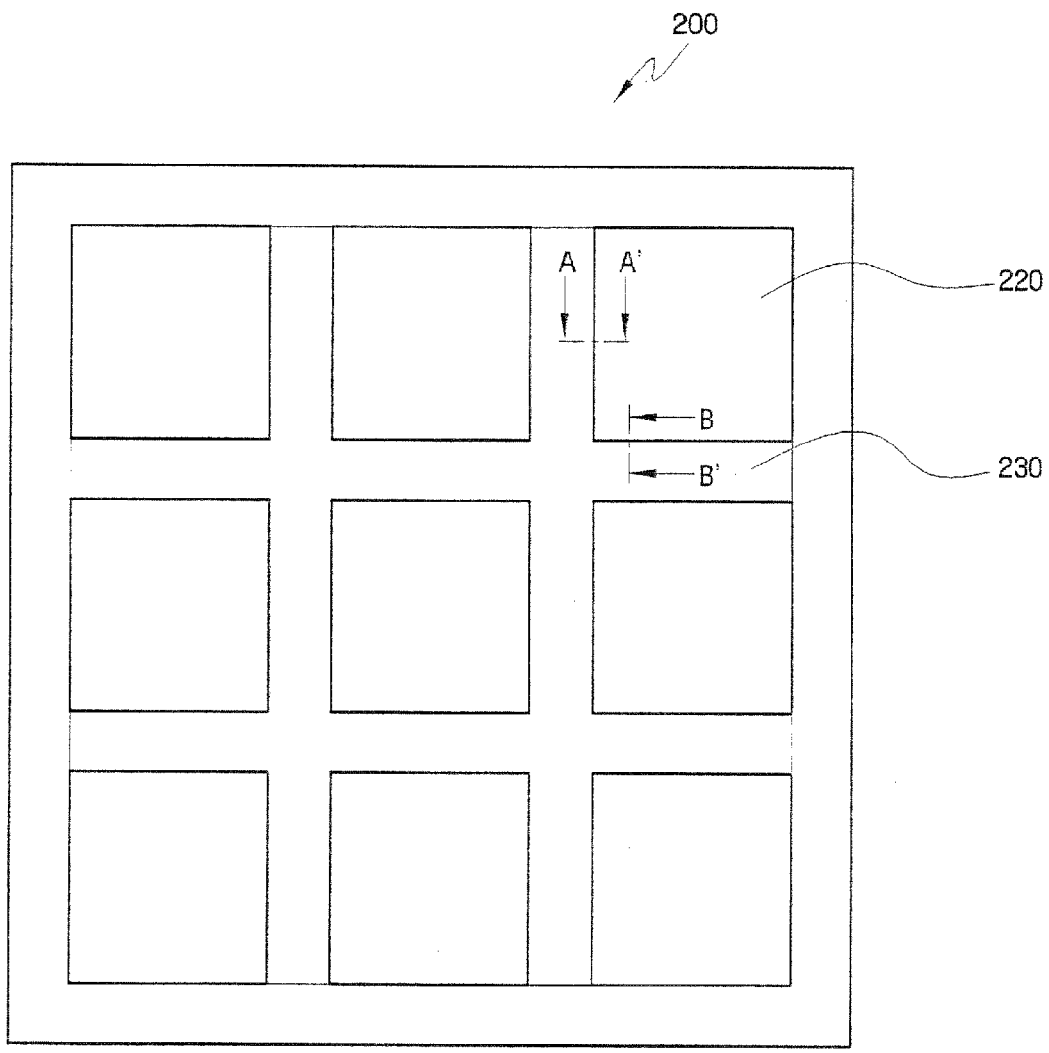
Figure 10:
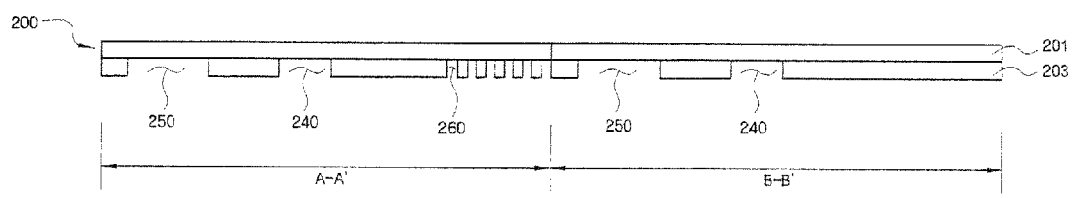

FIG. 9 is a plan view of a reticle used to form the slit patterns 132, and FIG. 10 is a cross-sectional view taken along lines A-A' and B-B' of FIG. 9.

Referring to FIGS. 9 and 10, the reticle 200 includes a plurality of chip areas 220 and scribe lane areas 230. Each of the chip areas 220 has a chip pattern formed thereon, and each of the scribe lane areas 230 has a scribe lane pattern formed thereon. Although a reticle used to expose 3×3 chips by one shot exposure is shown in FIG. 9, the arrangement of the chips may be modified in the form of 2×2, 2×3, or the like.

A light-shielding pattern 203 is formed on a reticle A-A', which includes areas not having monitoring patterns of the scribe lane areas 230 on a substrate 201, of the reticle 200. The substrate 201 is transparent against exposure light. The light-shielding pattern 203 defines transparent portions 260 corresponding to the slit patterns 132, another transparent portion 250 corresponding to the fuse opening 150, and still another transparent portion 240 corresponding to the pad opening 140. In addition, the light-shielding pattern 203 is also formed on a reticle B-B', which includes areas having monitoring patterns thereon. The light-shielding pattern 203 defines a transparent portion 250 corresponding to the fuse opening 150 and another transparent portion 240 corresponding to the pad opening 140. That is, the light-shielding pattern 203 shields the exposure light in the areas having monitoring patterns.

The transparent portions 260 corresponding to the slit patterns 132 have substantially the same structure as the slit patterns 132 shown in FIGS. 3A, 6, and 7.

FIGS. 9 and 10 illustrate a reticle to be applied to a positive resist. On the other hand, it is apparent that a reticle to be applied to a negative resist includes the light-shielding pattern formed in the transparent portion illustrated in FIGS. 9 and 10, and areas having the light-shielding pattern thereon changed into the transparent portion. Accordingly, the reticle to be applied to a negative resist is not shown for the sake of simplicity.

Figure 11:
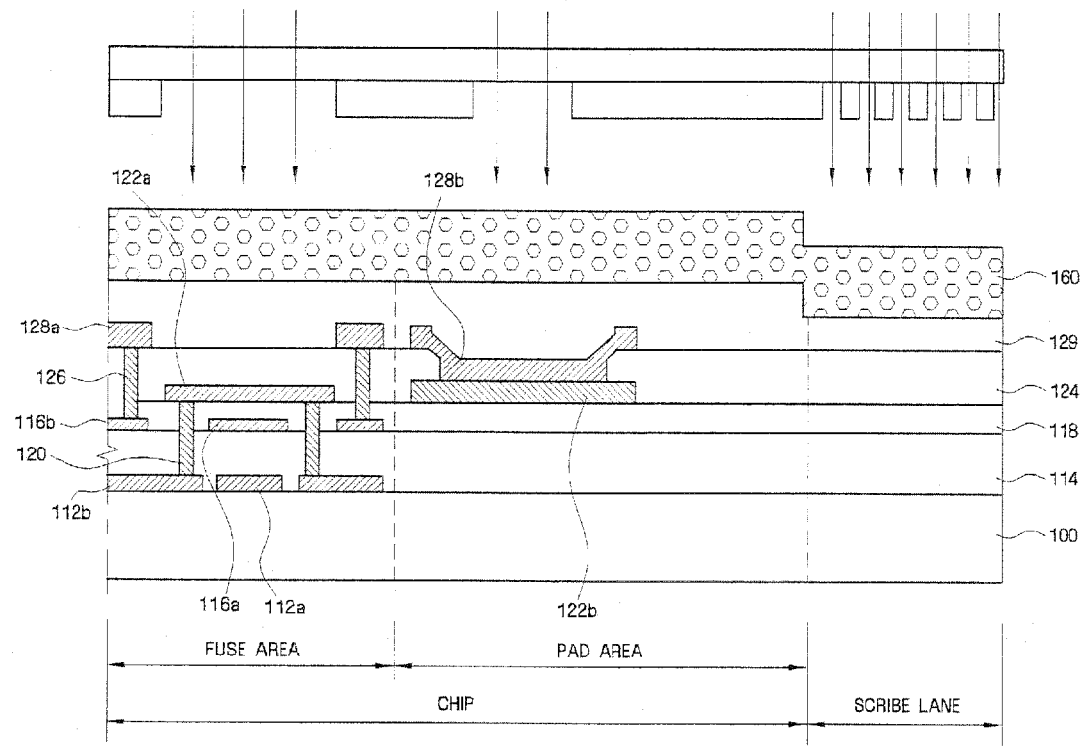

After a photoresist film 160 is coated on the passivation film 129 shown in FIG. 8, the wafer 10 is loaded in the stepper in which the reticle 200 shown in FIGS. 9 and 10 has been loaded. Then, as shown in FIG. 11, an exposure process is performed.

The light-shielding pattern 203 formed on the reticle 200 is transcribed on the wafer 10 by one shot exposure. Subsequently, while the reticle 200 is transferred, the entire wafer 10 is exposed.

Figure 12:
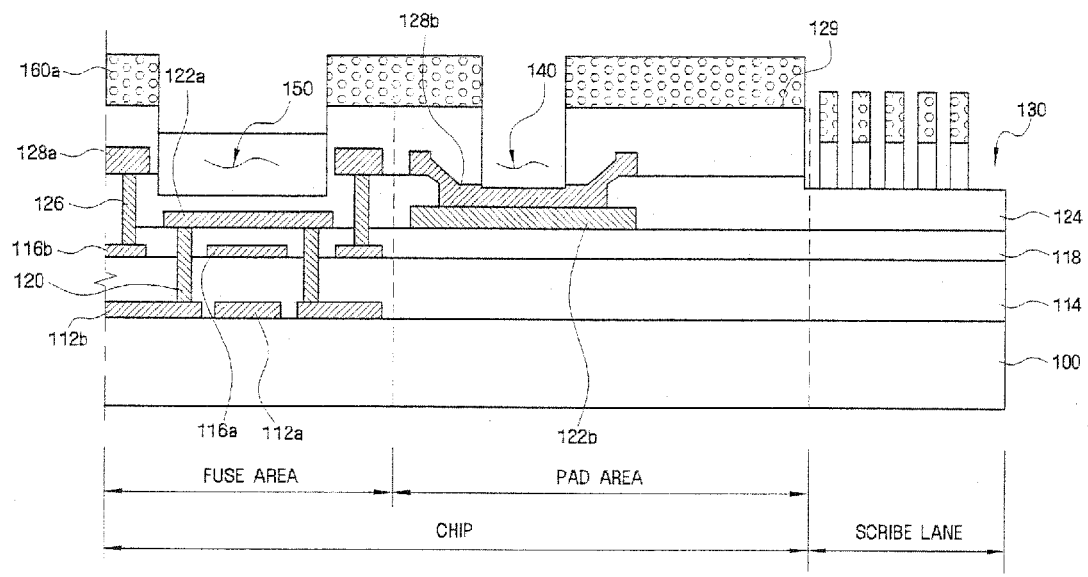

Finally, as shown in FIG. 12, the exposed photoresist film 160 is developed to form a photoresist pattern 160*a*. Then, the passivation film 129 and the intermetallic insulating film 124 are partially etched, using the photoresist pattern 160*a* as an etching mask, to engrave the slit patterns 132 on the scribe lanes.

At the same time, the fuse opening 150 having substantially the same depth as that of each slit pattern 132 is also formed in the fuse area. In addition, the pad opening 140 is also formed in the pad area.

After that, the wafer 10 is sawed along the scribe lanes to cut apart the wafer into a plurality of semiconductor dies (dicing) so that each die can be mounted into its own package through processes known to those skilled in the art, for example, die attaching and wire bonding. The succeeding processes are schematically described to avoid ambiguity.

More detailed descriptions related to some embodiments are described with reference to the following specific example. Since descriptions not described in this specification can be sufficiently analogized by those skilled in the art, descriptions not described in this specification will be omitted.

Several wafers, in which the width of each scribe lane is about 10 μm and a plurality of DRAM chips are formed, have been prepared. A passivation film, which includes a plurality of holes, e.g., slit patterns having a width of 3 μm, a length of 300 μm, and each space of 3 μm in accordance with an embodiment, is formed on the scribe lanes of a sample wafer of the wafers. Meanwhile, a passivation film is not formed on the scribe lanes of a comparative sample wafer.

Figure 13A:
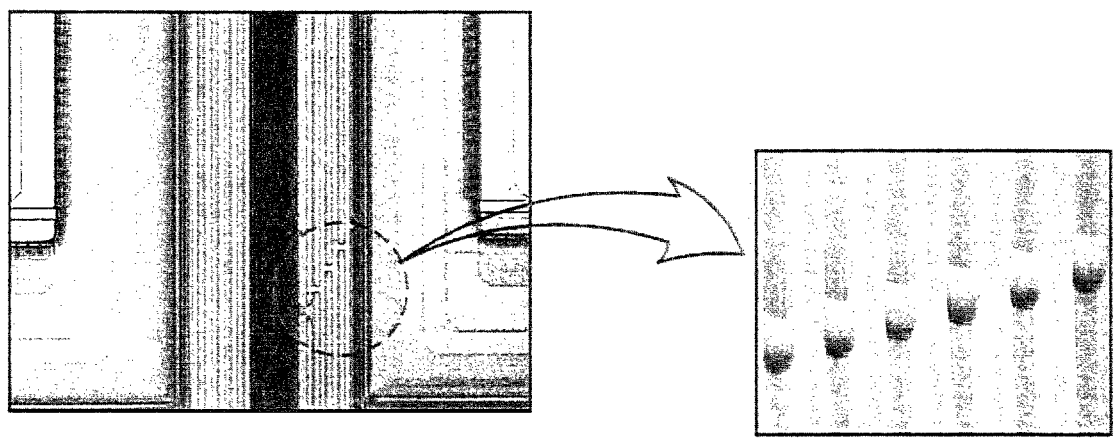
FIG. 13A is an image of a sample wafer according to some embodiments.

Subsequently, after the sawing process is performed, whether or not chipping occurs is observed. FIG. 13A shows the sample wafer according to the embodiment, and FIG. 13B shows the comparative sample wafer.

Figure 13B:
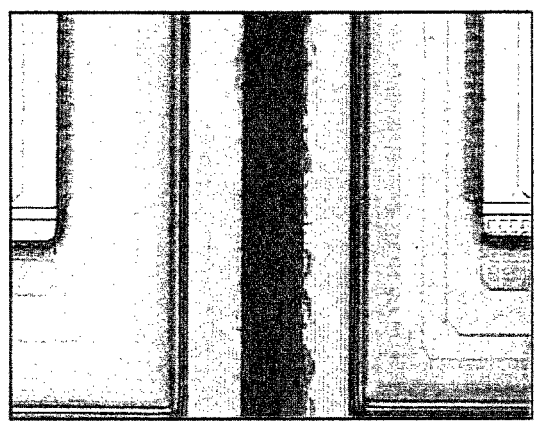
FIG. 13B is an image of a comparative sample wafer.

Referring to FIGS. 13A and 13B, it is understood that chipping hardly occurs in the sample wafer according to the embodiment, and occurs very much in the comparative sample wafer.

While the invention has been particularly shown and described with reference to exemplary embodiments thereof, it will be understood by those of ordinary skill in the art that various changes in form and details may be made therein without departing from the spirit and scope of the invention as defined by the following claims. Therefore, it is to be understood that the above-described embodiments have been provided only in a descriptive sense and will not be construed as placing any limitation on the scope of the invention.

According to some embodiments of the invention, since the passivation film including slit patterns, which are engraved on the scribe lane, is provided, the mechanical stress occurring during the sawing process using the blade can be easily dispersed. Further, since passivation line patterns defined by the slit patterns serve as barriers for the stress, it is possible to reduce chipping as much as possible. Furthermore, since the slit patterns are not formed on the passivation film in the area having the monitoring patterns formed thereon, it is possible to effectively prevent peeling from occurring on the monitoring patterns.

What is claimed is:

1. A wafer comprising:
   a plurality of chips;
   scribe lanes formed between the plurality of chips; and
   a passivation film formed on the plurality of chips and the scribe lanes, the passivation film having a plurality of slit patterns engraved on each scribe lane.
2. The wafer of claim 1, wherein the passivation film on the scribe lanes includes an enclosure pattern provided with bridges that connect a plurality of passivation line patterns with one another.
3. The wafer of claim 1, wherein the ends of the plurality of slit patterns are not aligned with one another.
4. The wafer of claim 1, wherein the plurality of slit patterns are alternately arranged.
5. The wafer of claim 1, wherein each of the scribe lanes includes areas not having monitoring patterns formed thereon and areas having monitoring patterns formed thereon, and
   the areas having monitoring patterns formed thereon do not include the engraved slit patterns and are covered with the passivation film.
6. The wafer of claim 1, wherein the passivation film formed on the chips includes fuse openings, and the depth of each slit pattern is substantially equal to that of each fuse opening.
7. The wafer of claim 1, wherein the width of each slit pattern at the central portion of each scribe lane is larger than that at other portions of each scribe lane.
8. The wafer of claim 1, wherein the width of each slit pattern near a central area of each scribe lane is gradually larger than the width of each slit pattern near an edge area of each scribe lane.

* * * * *

UNITED STATES PATENT AND TRADEMARK OFFICE
CERTIFICATE OF CORRECTION

PATENT NO. : 7,436,047 B2
APPLICATION NO. : 11/530568
DATED : October 14, 2008
INVENTOR(S) : Hung-Mo Yang It is certified that error appears in the above-identified patent and that said Letters Patent is hereby corrected as shown below:

Column 3, line 40, the word "lilted" should read -- lifted --.

Signed and Sealed this

Ninth Day of December, 2008

JON W. DUDAS
*Director of the United States Patent and Trademark Office*